US008715535B2

(12) United States Patent
Jee et al.

(10) Patent No.: US 8,715,535 B2
(45) Date of Patent: *May 6, 2014

(54) CONDUCTIVE PASTE AND ELECTRONIC DEVICE AND SOLAR CELL INCLUDING AN ELECTRODE FORMED USING THE CONDUCTIVE PASTE

(75) Inventors: Sang-Soo Jee, Hwaseong-si (KR); Eun-Sung Lee, Seoul (KR); Se-Yun Kim, Seoul (KR); Sang-Mock Lee, Yongin-si (KR); Jung Yun Won, Hwaseong-si (KR); Do-Hyang Kim, Seoul (KR)

(73) Assignees: Samsung Electronics Co., Ltd., Gyeonggi Do (KR); Industry-Academic Cooperation Foundation, Yonsei University, Seoul (KR)

( * ) Notice: Subject to any disclaimer, the term of this patent is extended or adjusted under 35 U.S.C. 154(b) by 298 days.

This patent is subject to a terminal disclaimer.

(21) Appl. No.: 13/016,403

(22) Filed: Jan. 28, 2011

(65) Prior Publication Data
US 2012/0031481 A1 Feb. 9, 2012

(30) Foreign Application Priority Data

Aug. 5, 2010 (KR) ........................ 10-2010-0075697

(51) Int. Cl.
*H01B 1/06* (2006.01)
(52) U.S. Cl.
USPC ........ 252/512; 252/513; 252/519.3; 136/244; 136/256; 136/263
(58) Field of Classification Search
USPC ........ 252/512, 513, 519.3; 136/244, 256, 263
See application file for complete search history.

(56) References Cited

U.S. PATENT DOCUMENTS

| 4,962,066 | A | 10/1990 | Starz et al. |
| 5,170,930 | A | 12/1992 | Dolbear et al. |
| 6,027,575 | A | 2/2000 | Paruchuri et al. |
| 6,420,067 | B1 | 7/2002 | Yoshioka |

(Continued)

FOREIGN PATENT DOCUMENTS

| EP | 1039 568 B1 | 9/1999 | |
| EP | 1039568 B1 * | 11/2009 | ............... H01M 4/58 |

(Continued)

OTHER PUBLICATIONS

Hilali, M. M. et al., Effect of Ag Particle Size in Thick-Film Ag Paste on the Electrical and Physical Properties of Screen Printed Contacts and Silicon Solar Cells, J. of the Electrochemical Society, 2006, vol. 153: 1; pp. A5-A11.

(Continued)

*Primary Examiner* — Khanh Tuan Nguyen
(74) *Attorney, Agent, or Firm* — Harness, Dickey & Pierce, P.L.C.

(57) ABSTRACT

According to an example embodiment, a conductive paste includes a conductive powder, a metallic glass having a supercooled liquid region, and an organic vehicle. The metallic glass may include an alloy having a disordered atomic structure that includes at least two metals. An electronic device and/or solar cell may include an electrode formed using the conductive paste. An electrode formed using a conductive paste according to example embodiments may have lower contact resistance than an electrode formed using a conductive paste that includes glass frits instead of a metallic glass.

18 Claims, 6 Drawing Sheets

(56) References Cited

U.S. PATENT DOCUMENTS

| | | | |
|---|---|---|---|
| 7,056,394 B2 | 6/2006 | Inoue et al. | |
| 7,147,727 B2 | 12/2006 | Kim et al. | |
| 7,399,370 B2 | 7/2008 | Inoue et al. | |
| 2002/0036034 A1* | 3/2002 | Xing et al. | 148/561 |
| 2004/0245507 A1 | 12/2004 | Nagai et al. | |
| 2005/0019203 A1 | 1/2005 | Saitoh et al. | |
| 2005/0211340 A1 | 9/2005 | Kim et al. | |
| 2006/0102228 A1 | 5/2006 | Sridharan et al. | |
| 2007/0034305 A1 | 2/2007 | Suh | |
| 2007/0072969 A1 | 3/2007 | Lee et al. | |
| 2007/0102676 A1 | 5/2007 | Lee et al. | |
| 2007/0137737 A1* | 6/2007 | Guo et al. | 148/403 |
| 2007/0157852 A1 | 7/2007 | Lee et al. | |
| 2008/0196794 A1 | 8/2008 | Blandin et al. | |
| 2009/0056798 A1* | 3/2009 | Merchant et al. | 136/256 |
| 2009/0101190 A1 | 4/2009 | Salami et al. | |
| 2009/0211626 A1 | 8/2009 | Akimoto | |
| 2009/0250106 A1 | 10/2009 | Hayashi et al. | |
| 2010/0037990 A1 | 2/2010 | Suh | |
| 2010/0096014 A1 | 4/2010 | Iida et al. | |
| 2010/0098840 A1 | 4/2010 | Du et al. | |
| 2010/0101637 A1 | 4/2010 | Yamasaki et al. | |
| 2011/0114170 A1 | 5/2011 | Lee et al. | |
| 2011/0162687 A1 | 7/2011 | Moon et al. | |
| 2012/0103409 A1 | 5/2012 | Kim et al. | |

FOREIGN PATENT DOCUMENTS

| | | |
|---|---|---|
| EP | 2325848 A2 | 5/2011 |
| JP | 10-040738 | 2/1998 |
| JP | 10144139 | 5/1998 |
| JP | 2002-298651 | 10/2002 |
| JP | 2003003246 | 1/2003 |
| JP | 2004091868 | 3/2004 |
| JP | 2005-050983 | 2/2005 |
| JP | 2008-010527 | 1/2008 |
| JP | 2009-099371 A | 5/2009 |
| JP | 2009-138266 A | 6/2009 |
| JP | 2009-197323 | 9/2009 |
| JP | 2010-018878 A | 1/2010 |
| JP | 2010133021 | 6/2010 |
| JP | 2010199196 | 9/2010 |
| KR | 1020020037772 A | 5/2002 |
| KR | 1020050087249 | 8/2005 |
| KR | 1020050096258 | 10/2005 |
| KR | 10-0677805 | 1/2007 |
| KR | 1020070106887 | 11/2007 |
| WO | 0131085 A2 | 5/2001 |
| WO | WO 01/31085 | 5/2001 |
| WO | WO 2005096320 | 10/2005 |
| WO | 2009108675 A1 | 9/2009 |
| WO | WO 2009/108675 | 9/2009 |
| WO | WO 2010/033281 | 3/2010 |

OTHER PUBLICATIONS

European Search Report dated Dec. 20, 2011.
Se Yun Kim et al. "Replacement of oxide glass with metallic glass for Ag screen printing metallization on Si emitter," App. Phys. Lett., Am. Inst. Phys., vol. 98, No. 222112 Jun. 3, 02011).
ASM Handbook. vol. 3 Alloy Phase Diagrams, The Materials Information Soc., Hugh Baker, Ed., ASM International (1992).
Lin et al., "Effect of Ni on glass-forming ability og Cu-Ti-based amorphous alloys", 2006, Transactions of Nonferrous Metals Society of China, 16, pp. 604-606.
Arai et al., "Nanocrystal Formation of Metals in Thermally Grown Thin Silicon Dioxide Layer by Ion Implantation and Thermal Diffusion of Implanted Atoms in Heat Treatment", J. Phys. Conf., Ser. 61, 2007; 41-45.
Powell et al., Development of metallic glass loaded polymer paste, J. of Materials Processing Tech., 2001, pp. 318-323.
Don-Ik Lee, et al., "Effect of TRITON™ X-based Dispersants Bearing a Carboyxlic Terminal Group on Rheological Properties of BAM/Ethyl Cellulose/Terpineol Paste", Journal of Applied Polymer Science, vol. 105, 2012-2019 (2007).
Don-Ik Lee, et al., "Plasma Display Material Prepared from a New Blue Phosphor Dispersion" Journal of Applied Polymer Science, vol. 108, 2571-2577 (2008).
Don-Ik Lee, et al., "Synthesis and Characterization of TRITON™ X-Based Surfactants with Carboxylic or Amino Groups in the Oxyethylene Chain End", Journal of Applied Polymer Science, vol. 104, 162-170 (2007).
Partial European Search Report for 10190652.7-2102 dated Mar. 23, 2011.
European Search Report for 11177515.1-1218 dated Feb. 5, 2013.
Wang X et al.: "Atomic structure and glass forming ability of Cu46Zr46A18 bulk metallic glass", J. Appl. Phys. 104, 093519 (2008).
Schubert, G. et al., "Silver thick film contact formation on lowly doped phosphorous emitters", 2005, Proceedings 20th EPVSEC, Barcelona, pp. 934-937.
Kim S J et al: "Silver/metallic glass paste for shallow emitter Si-solar cell", 26th European Photovoltaic Solar Energy Conference and Exhibition, Sep. 5-9, 2011, pp. 492-494, XP009160654.
Lee S-W et al: "Design of a bulk amorphous alloy containing Cu-Zr with simultaneous improvement in glass-forming ability and plasticity", Journal of Materials Research, vol. 22, No. 02, Feb. 2007, pp. 486-492, XP55031306.
Kim Y C et al: "Enhanced glass of forming ability and mechanical properties of new Cu-based bulk metallic glasses", Materials Science and Engineering A: Structural Materials: Properties, Microstructure & Processing, Lausanne, CH, vol. 437, No. 2, Nov. 15, 2006, pp. 248-253, XP027953056.
Neuhaus D-H et al: "Industrial Silicon Wafer Solar Cells", Advance in Optoelectronics, vol. 2007, XP 55031298.
Bashev V F et al: "Crystallization of Al-Ni alloys during rapid cooling", Russian Metallurgy, Allerton Press, Inc, No. 6, 1989, pp. 51-54, XP009160582.
Ivanov E et al: "Synthesis of nickel aluminides by mechanical alloying", Materials Letters, North Holland Publishing Company, Amsterdam, NL, vol. 7, No. 1-2, Aug. 1988, pp. 51-54, XP024149792.
Lim S S et al: "Assessment of the Al-Ag Binary Phase Diagram", CALPHAD, vol. 19, No. 2, 1995, pp. 131-141, XP55017954.
Wang Q et al: "Cluster line criterion and Cu-Zr-Al bulk metallic glass formation", Materials Science and Engineering A: Structural Materials: Properties, Microstructure & Processing, Lausanne, CH, vol. 449-451, Mar. 19, 2007, pp. 18-23, XP005914563.
Metallurgy Division of the Materials Science and Engineering Laboratory of NIST: "Ag-Cu-Sn System", Aug. 5, 2010, XP55031251, Retrieved from the Internet: http://web.archive.org/web/20100805072225/http://www.metallurgy.nist.gov/phase/solder/agcusn.html.
Oh C-S et al: "A thermodynamic study on the Ag-Sb-Sn system", Journal of alloys and compounds, elsevier sequoia, lausanne, CH, vol. 238, May 1, 1996, pp. 155-166, XP004080478.
Baren M R: "Ag-In (Silver-Indium)" In: White C E T, Okamoto H (Editors): "Phase Diagrams of Indium Alloys and their engineering applications", 1992, ASM International, Materials Park, XP008098250.
Gorshkov N N et al: "Explosive compaction of amorphous Cu-Sn powder prepared by the method of mechanical alloying", Combustion, Explosion, and shock waves, vol. 25, No. 2, 1989, pp. 244-247.
Salkar R A et al: "The sonochemical preparation of amorphous silver nanoparticles", Journal of materials chemistry, vol. 9, No. 6, 1999, pp. 1333-1335.
"Amorphous metal", Wikipedia, Oct. 21, 2010, XP55017848, Retrieved from the Internet: URL: http://en.wikipedia.org/w/index.php?title=amorphous_metal&oldid=392080524.
"Electrical resistivity of pure metals" in: "CRC Handbook of chemistry and physics, 77th edition", 1996, CRC Press, Boca raton, New york, London, Tokyo, XP002668350.
European Search Report for 11176323.1-1218 dated Dec. 20, 2011.
NIST, Properties of Lead-Free Solders, Release 4.0, Feb. 2002.

(56) References Cited

OTHER PUBLICATIONS

Notice of Allowance dated Jun. 12, 2013 in U.S. Appl. No. 13/208,705.
US Office Action dated Jun. 5, 2013 corresponding to U.S. Appl. No. 12/943,732.
US Office Action dated Oct. 23, 2013 corresponding to U.S. Appl. No. 12/943,732.
M. Chen, "A brief overview of bulk metallic glasses", NPG Asia Materials, vol. 3, Step. 2011, pp. 82-90.
Reda, I.M., et al., "Amorphous Cu-Ag Films With High Stability," International Centre for Theoretical Physics, 1982.
US Office Action dated Oct. 8, 2013 corresponding to U.S. Appl. No. 13/281,835.
Yi. S. et al. "Ni-based bulk amorphous alloys in the Ni-Ti-Zr-(Si,Sn) system"; Journal of Materials Research, vol. 15, No. 11, p. 2425-2430; Nov. 2000.
Wang, W. "Roles of minor additions in formation and properties of bulk metallic glasses" Progress in Materials Science. vol. 52 p. 540-596; 2007.

\* cited by examiner

CONDUCTIVE PASTE AND ELECTRONIC DEVICE AND SOLAR CELL INCLUDING AN ELECTRODE FORMED USING THE CONDUCTIVE PASTE

CROSS-REFERENCE TO RELATED APPLICATION

This application claims priority to Korean Patent Application No. 10-2010-0075697, filed on Aug. 5, 2010, the content of which in its entirety is herein incorporated by reference.

BACKGROUND

1. Field

This disclosure relates to a conductive paste, and an electronic device and a solar cell including an electrode formed using the conductive paste.

2. Description of the Related Art

A solar cell is a photoelectric conversion device that transforms solar energy into electrical energy. Solar cells have attracted much attention as a potentially infinite and pollution-free next generation energy source.

A solar cell includes p-type and n-type semiconductors. When an electron-hole pair ("EHP") is produced by light absorbed in a photoactive layer of the semiconductors, the solar cell produces electrical energy by transferring electrons and holes to the n-type and p-type semiconductors, respectively, and then collecting the electrons and holes in electrodes of the solar cell.

A solar cell desirably has as high efficiency as possible for producing electrical energy from solar energy. In order to improve this efficiency, the solar cell desirably absorbs light with less loss so that it may produce as many electron-hole pairs as possible, and then collects the produced charges without loss.

An electrode may be fabricated by a deposition method, which may include a complicated process, have high cost, and can take a long time. Accordingly, a simplified process, such as a screen printing a conductive paste including a conductive material has been suggested.

However, an electrode formed using a conductive paste may have lower conductivity because of non-electroconductive glass frit included in the conductive paste. Thus there remains a need for an improved conductive paste.

SUMMARY

An aspect of this disclosure provides a conductive paste which is capable of improving the conductivity of an electrode.

Another aspect of this disclosure provides an electronic device including an electrode including a product of the conductive paste.

Yet another aspect of this disclosure provides a solar cell including an electrode including a product of the conductive paste.

According to an aspect of this disclosure, provided is a conductive paste including a conductive powder, a metallic glass having a supercooled liquid region, and an organic vehicle.

The supercooled liquid region may range from about 5° C. to about 200° C.

The supercooled liquid region may range from about 20° C. to about 100° C.

The supercooled liquid region may be between a glass transition temperature and a crystallization temperature of the metallic glass. In the supercooled liquid region, the metallic glass may show a liquid-like behavior.

The glass transition temperature of the metallic glass may be about 100° C. or more.

The crystallization temperature of the metallic glass may be about 800° C. or less.

The conductive powder, the metallic glass, and the organic vehicle may be included in an amount of about 30 to about 98 weight percent (wt %), about 1 to about 50 wt %, and about 69 to about 1 wt %, respectively, based on a total weight of the conductive paste.

According to another aspect of the disclosure, an electronic device includes an electrode including a product of a conductive paste including a conductive powder, a metallic glass having a supercooled liquid region, and an organic vehicle.

The supercooled liquid region may range from about 5° C. to about 200° C.

The supercooled liquid region may range from about 20° C. to about 100° C.

The supercooled liquid region may range between a glass transition temperature and a crystallization temperature of the metallic glass. In the supercooled liquid region, the metallic glass may show a liquid-like behavior.

The glass transition temperature of the metallic glass may be about 100° C. or more, and the crystallization temperature of the metallic glass may be about 800° C. or less.

According to another aspect of the disclosure, a solar cell includes a semiconductor layer, and an electrode electrically connected with the semiconductor layer, wherein the electrode includes a product of a conductive paste including a conductive powder, a metallic glass having a supercooled liquid region, and an organic vehicle.

The supercooled liquid region may range from about 5° C. to about 200° C.

The supercooled liquid region may range from about 20° C. to about 100° C.

The supercooled liquid region may be between a glass transition temperature and a crystallization temperature of the metallic glass. In the supercooled liquid region, the metallic glass may show a liquid-like behavior.

The glass transition temperature of the metallic glass may be about 100° C. or more, and the crystallization temperature of the metallic glass may be about 800° C. or less.

In the supercooled liquid region, the conductive powder may diffuse into at least one of the metallic glass and the semiconductor layer.

The solar cell may further include a buffer layer including the metallic glass disposed between the semiconductor layer and the electrode.

The buffer layer may include a crystallized metallic glass and a crystallized conductive powder, each of which is derived from the conductive paste.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
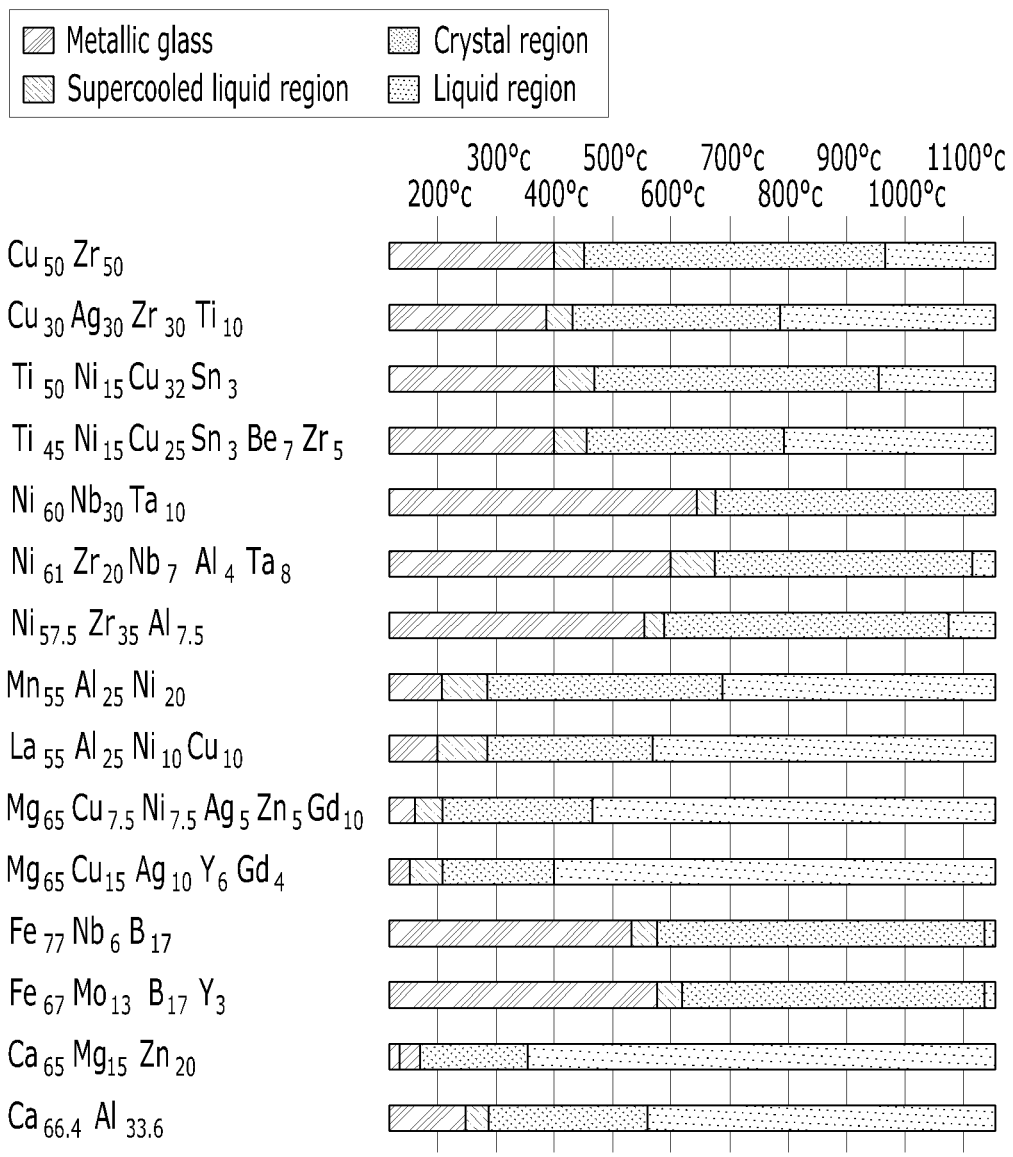
FIG. 1 is a diagram showing phase transition temperatures of representative metallic glasses having a supercooled liquid region.

Exemplary embodiments will hereinafter be described in further detail with reference to the accompanying drawings, in which various embodiments are shown. This disclosure may, however, be embodied in many different forms and should not be construed as limited to the exemplary embodiments set forth herein.

As used herein, the term "and/or" includes any and all combinations of one or more of the associated listed items. It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Alkyl" means a straight or branched chain saturated aliphatic hydrocarbon having the specified number of carbon atoms, specifically 1 to 12 carbon atoms, more specifically 1 to 6 carbon atoms. Alkyl groups include, for example, groups having from 1 to 50 carbon atoms (C1 to C50 alkyl).

Herein, the term 'metal' refers to a metal and a semimetal.

First, disclosed is a conductive paste according to an embodiment.

The conductive paste according to an embodiment includes a conductive powder, a metallic glass having a supercooled liquid region, and an organic vehicle.

The conductive powder may be an aluminum (Al)-containing metal such as aluminum or an aluminum alloy, a silver (Ag)-containing metal such as silver or a silver alloy, a copper (Cu)-containing metal such as copper (Cu) or a copper alloy, a nickel (Ni)-containing metal such as nickel (Ni) or a nickel alloy, or a combination thereof. However, the conductive powder is not limited thereto and may include other metals and an additive other than the metals.

The conductive powder may have a size (e.g., average largest particle size) ranging from about 0.1 to about 50 micrometers (μm), specifically about 0.5 to about 40 μm, more specifically about 1 to about 30 μm.

The metallic glass includes an alloy having a disordered atomic structure including two or more metals. The metallic glass may be an amorphous metal. Because the metallic glass has a low resistance, and thus is different from an insulating glass such as a silicate, it may be considered to be an electrical conductor at a voltage and a current of a solar cell.

The metallic glass has a supercooled liquid region ("ΔTsc"). The supercooled liquid region ("ΔTsc") is a region between a glass transition temperature ("Tg") and crystallization temperature ("Tc") of the metallic glass. The metallic glass may be plastically deformed in the supercooled liquid region, and shows liquid-like behavior. Accordingly, the metallic glass in the supercooled liquid region may wet against another material, such as a lower layer of a solar cell.

The metallic glass may have a supercooled liquid region ("ΔTsc") ranging from about 5° C. to about 200° C., that is, having a span from about 5° C. to about 200° C. In an embodiment, the metallic glass may have a supercooled liquid region ("ΔTsc") ranging from about 10° C. to about 180° C., specifically about 20° C. to about 160° C., or about 40° C. to about 140° C. When the metallic glass has a supercooled liquid region ("ΔTsc") within this range, it may sufficiently wet a lower layer as further disclosed below.

Within the range, the metallic glass may have a supercooled liquid region ("ΔTsc") ranging from (having a span of) about 20° C. to about 100° C., specifically about 30° C. to about 90° C.

On the other hand, the starting temperature of a supercooled liquid region ("ΔTsc"), that is, glass transition temperature ("Tg") of a metallic glass may be higher than about 100° C. The ending temperature of the supercooled liquid region ("ΔTsc"), that is, the crystallization temperature of a metallic glass, may be lower than about 800° C. Thus, in an embodiment, the metallic glass may have a supercooled liquid region ("ΔTsc") that has a span of about 5° C. to about 200° C., specifically about 20° C. to about 100° C., more specifically about 30° C. to about 90° C., within a temperature range from about 100° C. to about 800° C., specifically about 150° C. to about 750° C., more specifically about 200° C. to about 700° C.

Representative metallic glasses having a supercooled liquid region are depicted in FIG. 1.

FIG. 1 is a diagram showing phase transition temperatures of a metallic glasses having a supercooled liquid region.

Referring to FIG. 1, the metallic glass, such as $Cu_{50}Zr_{50}$, $Cu_{30}Ag_{30}Zr_{30}Ti_{10}$, $Ti_{50}Ni_{15}Cu_{32}Sn_3$, $Ti_{45}Ni_{15}Cu_{25}Sn_3Be_7Zr_5$, $Ni_{60}Nb_{30}Ta_{10}$, $Ni_{61}Zr_{20}Nb_7Al_4Ta_8$, $Ni_{57.5}Zr_{35}Al_{7.5}$, $Mn_{55}Al_{25}Ni_{20}$, $La_{55}Al_{25}Ni_{10}Cu_{10}$, $Mg_{65}Cu_{7.5}Ni_{7.5}Ag_5Zn_5Gd_{10}$, $Mg_{65}Cu_{15}Ag_{10}Y_6Gd_4$, $Fe_{77}Nb_6B_{17}$, $Fe_{67}Mo_{13}V_{17}Y_3$, $Ca_{65}Mg_{15}Zn_{20}$, or $Ca_{66.4}Al_{33.6}$ has a supercooled liquid region of about 5° C. to about 200° C., specifically about 20° C. to about 100° C., more specifically about 30° C. to about 90° C.

However, the metallic glasses of FIG. 1 are representative, and the metallic glass may include any metallic glass having the supercooled liquid region.

The organic vehicle may include an organic compound, and the organic vehicle may be contacted (e.g., mixed) with the conductive powder and the metallic glass to impart viscosity to the conductive paste. A solvent which can dissolve or suspend the organic compound may also be included.

The organic compound may include, for example, at least one selected from a (meth)acrylate; a cellulose such as ethyl cellulose; a phenol; an alcohol; a tetrafluoroethylene (e.g., TEFLON); or a combination thereof, and may further include an additive such as a surfactant, a thickener, or a stabilizer, or a combination thereof.

The solvent may be any solvent which is capable of dissolving or suspending any of the above compounds and may include, for example, at least one selected from terpineol, butylcarbitol, butylcarbitol acetate, pentanediol, dipentyne, limonene, ethyleneglycol alkylether, diethyleneglycol alkylether, ethyleneglycol alkylether acetate diethyleneglycol alkylether acetate, diethyleneglycol dialkylether acetate, triethyleneglycol alkylether acetate, triethylene glycol alkylether, propyleneglycol alkylether, propyleneglycol phenylether, dipropyleneglycol alkylether, tripropyleneglycol alkylether, propyleneglycol alkylether acetate, dipropyleneglycol alkylether acetate, tripropyleneglycol alkyl ether acetate, dimethylphthalic acid, diethylphthalic acid, dibutylphthalic acid, or desalted water.

The conductive powder, the metallic glass, and the organic vehicle may be included in an amount of about 30 to about 98 weight percent (wt %), about 1 to about 50 wt %, and 69 to about 1 wt %, specifically about 40 to about 95 weight percent (wt %), about 2 to about 40 wt %, and 58 to about 3 wt %, more specifically about 50 to about 90 weight percent (wt %), about 4 to about 30 wt %, and 46 to about 6 wt %, based on the total weight of the conductive paste.

The conductive paste may be disposed by screen-printing to provide an electrode for an electronic device.

Changes that occur upon heat treatment of the aforementioned conductive paste are illustrated in FIGS. 2 to 5C.

Figure 2:
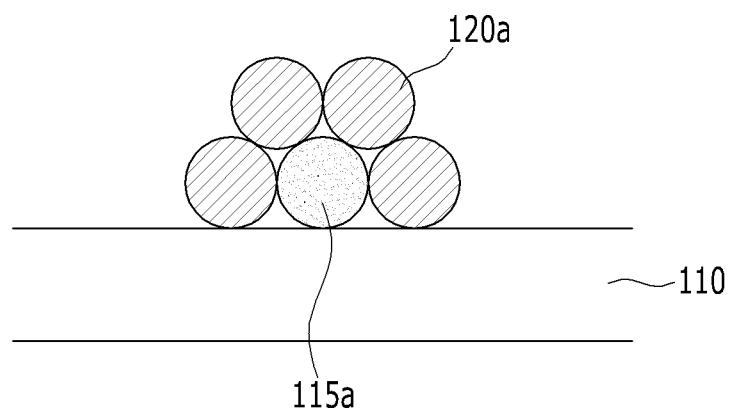
FIGS. 2 to 4 are a schematic diagram showing an embodiment of plastic deformation and contact of a metallic glass with a semiconductor substrate when an embodiment of a conductive paste is applied on the semiconductor substrate.
Figure 3:
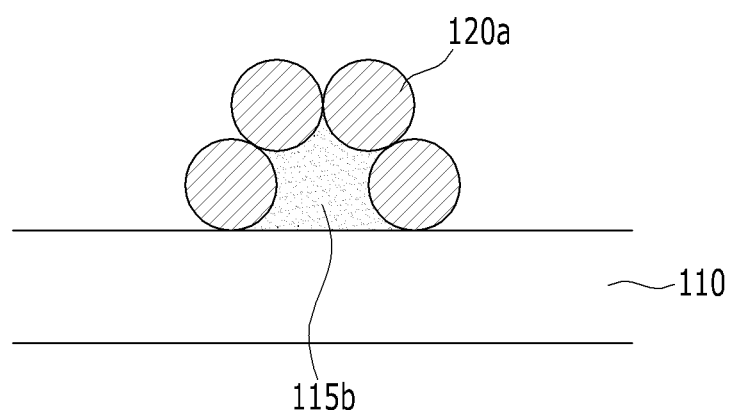
Figure 4:
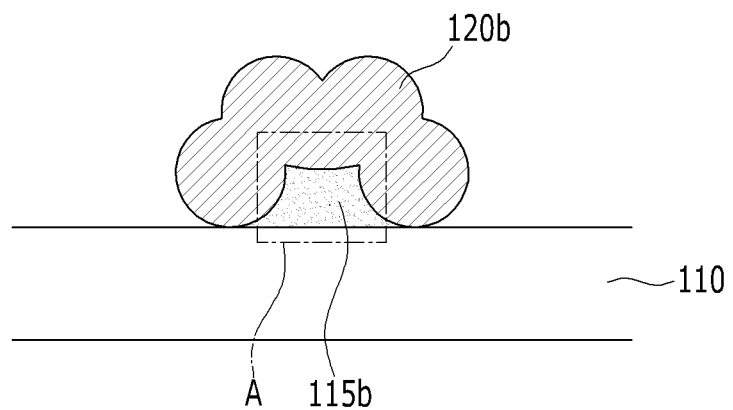
Figure 5A:
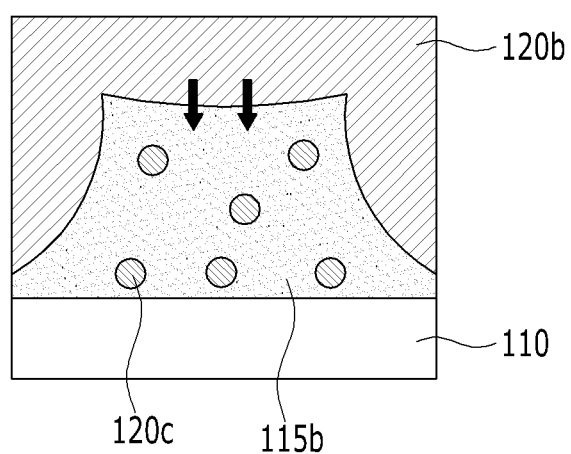
FIGS. 5A to 5C is a schematic diagram of region 'A' in FIG. 4.
Figure 5B:
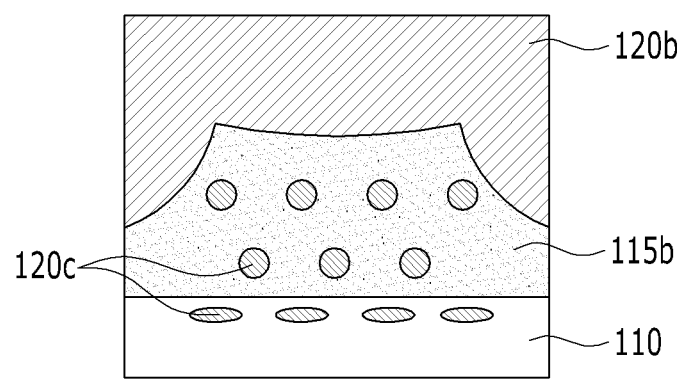
Figure 5C:
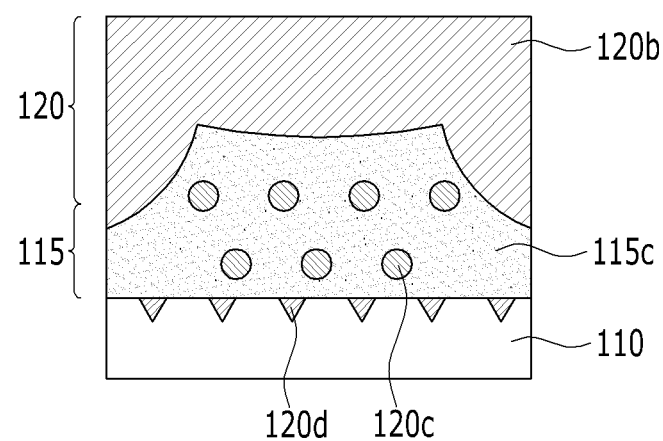

FIGS. 2 to 4 are a schematic diagram showing plastic deformation and contact of a metallic glass with a semiconductor substrate when an embodiment of a conductive paste is applied on the semiconductor substrate. FIGS. 5A to 5C is a schematic diagram of a region 'A' in FIG. 4.

Referring to FIG. 2, a conductive paste including a conductive powder 120a and a metallic glass 115a is applied on a semiconductor substrate 110. The conductive powder 120a and the metallic glass 115a may each respectively comprise a particle having a spherical shape, for example.

Referring to FIG. 3, when the metallic glass 115a is heated to a first temperature, which is higher than the glass transition temperature ("Tg"), the metallic glass 115a becomes soft and is turned into a liquid-like metallic glass 115b. The liquid-like metallic glass 115b may fill a gap among particles of a conductive powder 120a or wet the conductive powder 120a, forming a layer on the surface of semiconductor substrate 110. Herein, because the metallic glass 115a has a glass transition temperature ("Tg") which is lower than the sintering temperature of the conductive powder 120a, the metallic glass 115a becomes soft before the conductive powder 120a is sintered.

The liquid-like metallic glass 115b spreads over a large region of the semiconductor substrate 110 and wets a surface of the semiconductor substrate 110 to form a wetted region. The wetted region is where the metallic glass 115b contacts the semiconductor substrate 110 as well as where the conductive powder may permeate into the semiconductor substrate 110 when it is treated at a second temperature disclosed below. Accordingly, the more a metallic glass wets the semiconductor substrate, the larger contact area a final electrode has with a semiconductor substrate, providing a larger area for passage of charges produced in the semiconductor substrate by solar light to an electrode, and adhesion of the electrode to the semiconductor substrate is improved as well.

Referring to FIG. 4, when a conductive paste is heated to the second temperature, which is higher than a sintering temperature ("Ts"), the conductive powder 120a is sintered and closely bonded with neighboring particles of the conductive powder 120a, forming a conductive powder mass 120b.

Referring to FIGS. 3 and 4, the liquid-like metallic glass 115b is a supercooled liquid and thus, may wet the semiconductor substrate 110.

Referring to FIG. 5A, when the liquid-like metallic glass 115b is a supercooled liquid, some conductive particles 120c of the conductive powder mass 120b may diffuse into the liquid-like metallic glass 115b. Herein, the larger supercooled liquid region a metallic glass has, the longer it exists as a liquid-like metallic glass 115b. The supercooled liquid region may improve wettability of the metallic glass 115b against the semiconductor substrate 110 and increase the amount of the conductive particle 120c that diffuses into the liquid-like metallic glass 115b.

Referring to FIG. 5B, when a metallic glass is heated to a third temperature which is higher than the second temperature, the conductive particles 120c diffused into the liquid-like metallic glass 115b may permeate into the semiconductor substrate 110. Herein, because the liquid-like metallic glass 115b wets the semiconductor substrate 110, the liquid-like metallic glass 115b may more closely contact the semiconductor substrate 110, providing an area where the conductive particles 120c permeate into the semiconductor substrate 110.

Referring to FIG. 5C, when the semiconductor substrate 110 is cooled down, the conductive particles 120c permeated into the semiconductor substrate 110 crystallize, forming crystallized conductive particles 120d which crystallize at the surface of the semiconductor substrate 110. Also, the liquid-like metallic glass 115b may also crystallize to form a crystalline metallic glass 115c. The conductive particle 120c inside the metallic glass may also crystallize.

Accordingly, when the conductive powder mass 120b is formed into an electrode 120, a buffer layer 115 including the crystalline metallic glass 115c may be further disposed between the electrode 120 and the semiconductor substrate 110.

The buffer layer 115 and the crystallized conductive particle 120d on the surface of the semiconductor substrate 110 may decrease a contact resistance between semiconductor substrate 110 and the electrode 120, and thus reduce loss of charge generated by solar energy and more effectively transfer charges produced in the semiconductor substrate 110 by solar energy to the electrode 120. Accordingly, a solar cell may have improved efficiency.

The electrode may be used as a conductive electrode in various electronic devices.

A representative electronic device is a solar cell.

Figure 6:
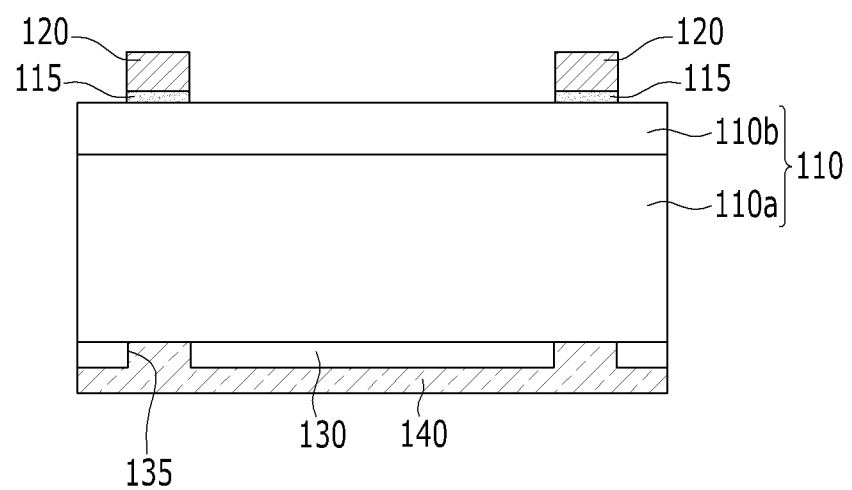
FIG. 6 is a cross-sectional view of an embodiment of a solar cell.

Referring to FIG. 6, a solar cell according to an embodiment is disclosed in further detail.

FIG. 6 is a cross-sectional view showing a solar cell according to an embodiment.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, the spatial relationship of components will be described with respect to a semiconductor substrate 110 for better understanding and ease of description, but the present disclosure is not limited thereto. In addition, a solar energy incident side of a semiconductor substrate 110 is termed a front side, and the opposite side is called a rear side, although alternative configurations are possible.

Referring to FIG. 6, a solar cell according to an embodiment may include a semiconductor substrate 110 including a lower semiconductor layer 110a and an upper semiconductor layer 110b.

The semiconductor substrate 110 may comprise a crystalline silicon or a compound semiconductor. The crystalline silicon may be, for example, a silicon wafer. Either of the lower semiconductor layer 110a and the upper semiconductor layer 110b may be a semiconductor layer doped with a p-type impurity, while the other may be a semiconductor layer doped with an n-type impurity. For example, the lower semiconductor layer 110a may be a semiconductor layer doped with a p-type impurity, and the upper semiconductor layer 110b may be a semiconductor layer doped with an n-type impurity. Herein, the p-type impurity may be a Group III element such as boron (B), and the n-type impurity may be a Group V element such as phosphorus (P).

The surface of the upper semiconductor layer 110b may be textured, and the textured surface may be provided by surface texturing. The surface-textured upper semiconductor layer 110b may have protrusions and depressions, and may comprise a pyramidal shape, or may have a porous structure having a honeycomb shape, for example. The surface-textured upper semiconductor layer 110b may have an enhanced surface area to improve the light-absorption rate and decrease reflectivity, thereby improving efficiency of a solar cell.

An anti-reflection coating (not shown) may be disposed on the surface-textured upper semiconductor layer 110b.

A front electrode 120 is disposed on the upper semiconductor layer 110b. The front electrode 120 may be arranged in parallel to the direction of the substrate and may have a grid pattern shape to reduce shadowing loss and sheet resistance.

The front electrode 120 may comprise a conductive material, for example, a low resistance conductive material such as silver (Ag).

The front electrode 120 may be formed by screen printing a conductive paste. The conductive paste may be the same as described above.

A buffer layer 115 is disposed between the upper semiconductor layer 110b and the front electrode 120 by heat treating the conductive paste disposed to form the front electrode 120. The buffer layer 115 may be conductive due to inclusion of a metallic glass. Because the buffer layer 115 has portions that contact the electrode 120 and the upper semiconductor layer 110b, it may decrease loss of electric charges by improving a path for transferring the electric charges between the upper semiconductor layer 110b and the front electrode 120. The improvements may include reduction of resistive losses, for example.

The metallic glass of the buffer layer 115 is derived from the conductive paste used to form the front electrode 120. The metallic glass may melt before the conductive material of the front electrode 120 during processing, so that the metallic glass is disposed under the front electrode 120 to form the buffer layer.

A bus bar electrode (not shown) may be disposed on the front electrode 120. The bus bar electrode can connect adjacent solar cells of a plurality of solar cells.

A dielectric layer 130 may be disposed under the semiconductor substrate 110. The dielectric layer 130 may increase efficiency of a solar cell by substantially or effectively preventing recombination of electric charges and leaking of electric current. The dielectric layer 130 may include a through-hole 135. Through the through-hole 135, a rear electrode 140, which is further disclosed below, may contact the semiconductor substrate 110.

The dielectric layer 130 may comprise silicon oxide ($SiO_2$), silicon nitride ($SiN_x$), aluminum oxide ($Al_2O_3$), or a combination thereof, and may have a thickness of about 100 to about 2000 angstroms (Å), specifically about 200 to about 1800 Å. The dielectric layer 130 may be omitted.

A rear electrode 140 is disposed under the dielectric layer 130. The rear electrode 140 may comprise a conductive material, for example, an opaque metal such as aluminum (Al). The rear electrode 140 may be formed by a screen printing method using a conductive paste in the same manner as the front electrode 120.

A buffer layer (not shown) is disposed between the rear electrode 140 and the lower semiconductor layer 110a in the same manner as the front electrode 120.

Hereinafter, a method of manufacturing the solar cell is further disclosed with reference to FIG. 6.

First, prepared is a semiconductor substrate 110, which may be a silicon wafer, for example. The semiconductor substrate 110 may be doped with a p-type impurity, for example.

Then, the semiconductor substrate 110 may be subjected to a surface texturing treatment. The surface-texturing treatment may be performed with a wet method using a strong acid such as nitric acid, or hydrofluoric acid, or a strong base such as sodium hydroxide, or by a dry method, such as plasma treatment.

Then, the semiconductor substrate 110 may be doped with an n-type impurity, for example. The n-type impurity may be doped by diffusing $POCl_3$, or $H_3PO_4$, or the like at a high temperature. The semiconductor substrate 110 includes a lower semiconductor layer 110a and an upper semiconductor layer 110b doped with different impurities from each other.

Then, a conductive paste for a front electrode is applied on the upper semiconductor layer 110b. The conductive paste for a front electrode may be provided by a screen printing method. The screen printing method includes applying the conductive paste, which comprises a conductive powder, a metallic glass, and an organic vehicle, on a surface where a front electrode is disposed and drying the same.

As further disclosed above, the conductive paste may include a metallic glass. The metallic glass may be prepared using any suitable method, such as melt spinning, infiltration casting, gas atomization, ion irradiation, or mechanical alloying.

Then, the conductive paste for a front electrode may be dried.

A dielectric layer 130 may be provided by laminating aluminum oxide (e.g., $Al_2O_3$) or silicon oxide (e.g., $SiO_2$) on the rear side of the semiconductor substrate 110, for example, in a plasma enhanced chemical vapor deposition ("PECVD") method.

Then, a through-hole 135 may be provided on a portion of the dielectric layer 130 by ablation with a laser, for example.

The conductive paste for a rear electrode is subsequently applied on a side of the dielectric layer 130 opposite the semiconductor substrate 110 by a screen printing method.

Next, the conductive paste for a rear electrode is then dried.

Next, the conductive pastes for the front and the rear electrodes are heat treated, i.e., fired. The conductive pastes for the front and the rear electrodes may be heat-treated individually or they may be heat-treated at the same time. Thus the conductive pastes for the front and the rear electrodes may be co-fired.

The firing may be performed at a temperature which is higher than the melting temperature of the conductive metal in a furnace, for example, at a temperature ranging from about 400° C. to about 1000° C., specifically about 450° C. to about 950° C., more specifically about 500° C. to about 900° C.

Hereinafter, a solar cell according to another embodiment is disclosed referring to FIG. 7.

Figure 7:
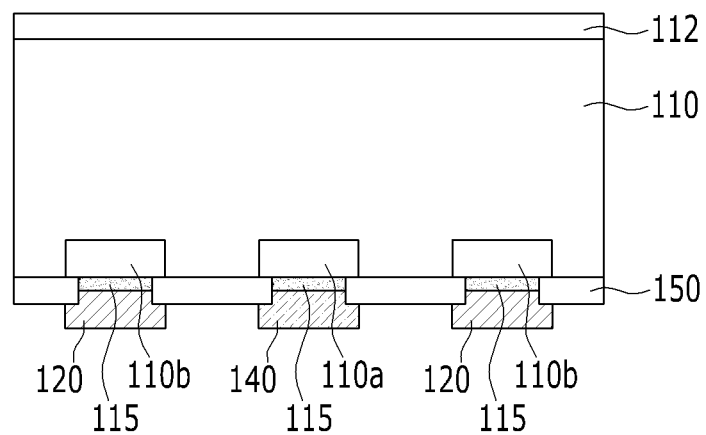
FIG. 7 is a cross-sectional view of another embodiment of a solar cell.

FIG. 7 is a cross-sectional view showing a solar cell according to another embodiment.

A solar cell may include a semiconductor substrate 110 doped with a p-type or an n-type impurity. The semiconductor substrate 110 may include a first doping region 111a and second doping region 111b that are provided on the rear side of the semiconductor substrate 110 and are doped with different impurities than each other.

For example, the first doping region 111a may be doped with an n-type impurity, and the second doping region 111b may be doped with a p-type impurity. The first doping region 111a and the second doping region 111b may be alternately disposed on the rear side of the semiconductor substrate 110.

The front side of the semiconductor substrate 110 may be surface-textured, and therefore may enhance the light-absorption rate and decrease the reflectivity, thereby improving efficiency of a solar cell.

An insulation layer 112 is provided on the semiconductor substrate 110. The insulation layer 112 may be may comprise an insulating material that absorbs little light, for example silicon nitride ($SiN_x$), silicon oxide ($SiO_2$), titanium oxide ($TiO_2$), aluminum oxide ($Al_2O_3$), magnesium oxide (MgO), cerium oxide ($CeO_2$), or a combination thereof. The insulation layer 112 may be a single layer or more than one layer. The insulation layer 112 may have a thickness ranging from about 200 to about 1500 Å, specifically 300 to about 1400 Å, more specifically about 400 to about 1300 Å.

The insulation layer 112 may be an anti-reflective coating ("ARC") that decreases the reflectivity of light and increases selectivity of a particular wavelength region on the surface of the solar cell, and simultaneously improves properties of silicon on the surface of the semiconductor substrate 110, thereby increasing efficiency of the solar cell.

A dielectric layer 150 including a penetration part may be disposed on the rear side of the semiconductor substrate 110.

The front electrode 120 electrically connected with the first doping region 111a and the rear electrode 140 electrically connected with the second doping region 111b are disposed on the rear side of the semiconductor substrate 110, respectively. The front electrode 120 and the first doping region 111a may be contacted through a through-hole, and the rear electrode 140 and the second doping region 111b may be in contact through a through-hole. The front electrode 120 and the rear electrode 140 may be alternately disposed.

As disclosed in the above embodiment, the front electrode 120 and the rear electrode 140 may be disposed using a conductive paste including a conductive powder, a metallic glass, and an organic vehicle, which is the same as described above.

A buffer layer 115 is disposed between the first doping region 111a and the front electrode 120, or between the second doping region 111b and the rear electrode 140. The buffer layer 115 may be electrically conductive due inclusion of a metallic glass. Because the buffer layer 115 includes portions contacting either the front electrode 120 or the rear electrode 140, and portions contacting either the first doping region 111a or the second doping region 111b, respectively, loss of electric charge may be decreased by improving the path for transferring electric charge between the first doping region 111a and the front electrode 120, or between the second doping region 111b and the rear electrode 140. In addition, the buffer layer 115 may substantially or effectively prevent a material of the front electrode 120 or the rear electrode 140 from diffusing into the first or second doping regions 111a or 111b, respectively.

A solar cell according to the embodiment including both of the front electrode 120 and the rear electrode 140 on the rear surface of the solar cell may decrease an area where a metal is disposed on the front surface. This may decrease shadowing loss and increase solar cell efficiency.

Hereinafter, the method of manufacturing a solar cell will be further disclosed referring to FIG. 7.

First, a semiconductor substrate 110 doped with, for example, an n-type impurity is prepared. Then, the semiconductor substrate 110 is surface-textured, and insulation layer 112 and dielectric layer 150 are disposed on a front side and a rear side of the semiconductor substrate 110, respectively. The insulation layer 112 and the dielectric layer 150, may be provided by chemical vapor deposition ("CVD"), for example.

Then, the first doping region 111a and the second doping region 111b may be disposed by sequentially doping a p-type impurity and an n-type impurity at a high concentration, for example $10^{16}$ to $10^{22}$ atom/cc, on the rear side of the semiconductor substrate 110.

Then, a conductive paste for a front electrode is applied on a portion of the dielectric layer 150 corresponding to the first doping region 111a, and a conductive paste for a rear electrode is applied on a portion of the dielectric layer 150 corresponding to the second doping region 111b. The conductive paste for the front electrode and the conductive paste for the rear electrode may be disposed by a screen printing method, for example, wherein the conductive paste may comprise a conductive powder, a metallic glass, and an organic vehicle.

Next, the conductive paste for the front electrode and the conductive paste for the rear electrode may be fired together or separately. The firing may be performed in a furnace at a temperature which is higher than the melting temperature of a conductive metal.

Herein, the conductive paste is applied to provide an electrode for a solar cell, but may be used for an electrode for other electronic devices, such as a plasma display panel ("PDP"), a liquid crystal display ("LCD"), and an organic light emitting diode ("OLED").

The following examples illustrate this disclosure in further detail. However, it is understood that this disclosure shall not be limited by these examples.

EXAMPLE 1

Preparation of a Conductive Paste

Silver (Ag) powder and the metallic glass $Cu_{43}Zr_{43}Al_7Ag_7$ are added to an organic vehicle including ethylcellulose as a binder and butyl carbitol as a solvent. Herein, the silver (Ag) powder, the metallic glass $Cu_{43}Zr_{43}Al_7Ag_7$, and the organic vehicle are respectively mixed in an amount of about 84 weight percent (wt %), about 4 wt %, and about 12 wt %, respectively, based on the total weight of the conductive paste.

The mixture is kneaded with a 3-roll mill to provide the conductive paste.

Electrode Fabrication

The conductive paste is coated on a silicon wafer by screen-printing. The coated product is sharply heated up to about 500° C. and then slowly heated up to about 900° C. for 20 to 60 seconds using a belt furnace. Then, the coated product is cooled down to form an electrode.

COMPARATIVE EXAMPLE 1

A conductive paste is prepared according to the same method as Example 1, except a $PbO$—$SiO_2$-based glass frit is used instead of a metallic glass. An electrode is then formed using the same method as in Example 1.

Evaluation

The contact resistance of the electrodes according to Example 1 and Comparative Example 1 are measured. The contact resistance is measured using a transfer length method ("TLM").

The results are provided in Table 1.

TABLE 1

|  | Contact resistance (m Ω cm$^2$) |
| --- | --- |
| Example 1 | 51 |
| Comparative Example 1 | 72 |

As shown in Table 1, the electrode of Example 1 has lower contact resistance than the electrode of Comparative Example 1. While not wanting to be bound by theory, it believed that the reduced contact resistance is because the conductive paste of the electrode of Example 1 includes a metallic glass with a super-cooled liquid region and has improved conductivity compared with the conductive paste of the electrode of Comparative Example 1.

While this disclosure has been described in connection with what is presently considered to be practical exemplary embodiments, it is to be understood that the invention is not limited to the disclosed embodiments, but, on the contrary, is intended to include various modifications and equivalent arrangements included within the spirit and scope of the appended claims.

What is claimed is:

1. A conductive paste comprising:
   a conductive powder,
   a metallic glass having a supercooled liquid region,
      the metallic glass including an alloy having a disordered atomic structure that includes at least two metals,
      the supercooled liquid ranging from about 5° C. to about 200° C., and an organic vehicle.

2. The conductive paste of claim 1, wherein the supercooled liquid region ranges from about 20° C. to about 100° C.

3. The conductive paste of claim 1, wherein the supercooled liquid region is between a glass transition temperature and a crystallization temperature of the metallic glass, and in the supercooled liquid region, the metallic glass shows a liquid-like behavior.

4. The conductive paste of claim 3, wherein the glass transition temperature of the metallic glass is about 100° C. or more.

5. The conductive paste of claim 3, wherein the crystallization temperature of the metallic glass is about 800° C. or less.

6. The conductive paste of claim 1, wherein the conductive powder, the metallic glass, and the organic vehicle are included in an amount of about 30 to about 98 weight percent, about 1 to about 50 weight percent, and about 69 to about 1 weight percent, respectively, based on a total weight of the conductive paste.

7. An electronic device comprising:
   an electrode comprising a product of the conductive paste of claim 1.

8. The electronic device of claim 7, wherein the supercooled liquid region ranges from about 20° C. to about 100° C.

9. The electronic device of claim 7, wherein the supercooled liquid region is between a glass transition temperature and a crystallization temperature of the metallic glass, and in the supercooled liquid region, the metallic glass shows a liquid-like behavior.

10. The electronic device of claim 9, wherein the glass transition temperature of the metallic glass is about 100° C. or more, and the crystallization temperature of the metallic glass is about 800° C. or less.

11. A solar cell comprising:
    a semiconductor layer, and an electrode electrically connected with the semiconductor layer, wherein the electrode comprises a product of the conductive paste of claim 1.

12. The solar cell of claim 11, wherein the supercooled liquid region ranges from about 20° C. to about 100° C.

13. The solar cell of claim 11, wherein the supercooled liquid region is between a glass transition temperature and crystallization temperature of the metallic glass, and in the supercooled liquid region, the metallic glass shows a liquid-like behavior.

14. The solar cell of claim 13, wherein the glass transition temperature of the metallic glass is about 100° C. or more, and the crystallization temperature of the metallic glass is about 800° C. or less.

15. The solar cell of claim 13, wherein in the supercooled liquid region, the conductive powder diffuses into at least one of the metallic glass and the semiconductor layer.

16. The solar cell of claim 11, wherein the solar cell further comprises a buffer layer including the metallic glass disposed between the semiconductor layer and the electrode.

17. The solar cell of claim 16, wherein the buffer layer comprises a crystallized metallic glass and a crystallized conductive powder, each of which is derived from the conductive paste.

18. The conductive paste of claim 1, wherein the alloy of the metallic glass includes two to six metals.

\* \* \* \* \*